United States Patent [19]

Bianchi

[11] Patent Number: 4,756,077
[45] Date of Patent: Jul. 12, 1988

[54] ASSEMBLY PLATFORM FOR AN EQUIPPING OF PRINTED CIRCUIT BOARDS

[75] Inventor: Marco Bianchi, Meilen, Switzerland

[73] Assignee: Kontakt-Systeme Inter AG, Engelberg, Switzerland

[21] Appl. No.: 8,773

[22] Filed: Jan. 30, 1987

[30] Foreign Application Priority Data

Jan. 7, 1987 [DE] Fed. Rep. of Germany ....... 8700220

[51] Int. Cl.⁴ .............................................. B23P 19/00
[52] U.S. Cl. ......................................... 29/740; 29/836; 29/840; 228/6.2; 228/175; 156/297; 156/499
[58] Field of Search ................. 29/840, 740, 832, 836; 228/180.2, 6.2, 175; 156/499, 297

[56] References Cited

U.S. PATENT DOCUMENTS

| | | | |
|---|---|---|---|
| 3,420,430 | 1/1969 | Goetz et al. | 228/6.2 |
| 4,274,196 | 6/1981 | Lemmer | 29/836 |
| 4,511,421 | 4/1985 | Küehn et al. | 29/740 |
| 4,598,459 | 7/1986 | Klink et al. | 29/836 |

Primary Examiner—P. W. Echols
Attorney, Agent, or Firm—Paul & Paul

[57] ABSTRACT

The assembly platform is provided with a heatable working surface allowing an equipping of printed circuit boards which can be temporarily mounted thereto. Individual devices or components, respectively, can be retrieved via a retrieving opening from a component storage rotary carousel including a plurality of compartments which components are placed thereafter on the printed circuit board. At a given time only one of the compartments is accessible. A heating chamber allows a preheating of the soldering paste of a setting of adhesives for mounted components prior to the soldering proper thereof. The equipped printed circuit board pretreated in the heating room is repositioned on the working surface for the final soldering. This assembly platform allows completing all equipping steps of the SMT-technique at one single operating station.

9 Claims, 1 Drawing Sheet 4,756,077

ASSEMBLY PLATFORM FOR AN EQUIPPING OF PRINTED CIRCUIT BOARDS

BACKGROUND OF THE INVENTION

1. Field of the invention

The present invention relates to an assembly platform for equipping printed circuit boards with surface mounted components. This equipping procedure is generally known as SMT (surface mounting technology) and utilizes so called SMD (surface mounted devices) components or devices, respectively, which differ from the usual electronic devices or components, respectively, basically in that they comprise no connecting wires, rather they are e.g. equipped with contact caps or lateral projections which are directly mounted or coupled, respectively, to the respective conduit paths.

2. Description of the prior art

The equipping of printed circuit boards by such SMD devices could be made hitherto only by utilizing very extensive apparatuses. Specifically the operator or working place at which the device or components, respectively, were placed onto the printed circuit board were spacially separated from the process areas or rooms in which the final soldering e.g. according to the reflowmethod was made. Corresponding apparatuses including assembly devices for an equipping of printed circuit boards are extremely costly and economical in use mainly in case of a large series production. Because equipment suitable for assembling a single SMD circuit or a short series of SMD circuits for educational, necessary to employ the generally available large scale assembly techniques instead.

SUMMARY OF THE INVENTION

It is therefore an object of the present invention to overcome mentioned drawbacks and to provide an apparatus which allows a proper equipping of printed circuit boards in small businesses, assembly plants or in laboratories. A further object of the invention is to provide an assembly platform for equipping printed circuit boards with surface mounted components which assembly platform comprises a plate-shaped chassis having an upper surface including a heatable working surface for receipt of a respective circuit board; a component storage rotary carousel located adjacent thereof and below the upper surface and having a plurality of component storage compartments, of which each individual compartment can be aligned with a component pick-up and retrieving opening in the upper surface of the chassis while all other components remain covered by the upper surface; and a closable heating chamber for a pre-baking of solder paste and curing of surface mounting adhesives.

According to a preferred embodiment the chassis has a generally rectangular upper surface and comprises four quadrants: (1) the component storage rotary carousel, located in the quadrant facing the operator side of the assembly platform and located adjacent the assembly platform's left hand side, (2) the working surface, located in the quadrant facing the operator side of the assembly platform, located adjacent the assembly platform's, (3) the area for component dispensers for tape- or stickfeeders, located behind the working surface and (4) the closable heating chamber, located behind the component storage rotary carousel.

This disposition allows an operator to conduct all steps regarding preparation, equipping, assembling and soldering of SMD-components correctly, speedily and economically at one single assembling station. The previously required use of a plurality of single apparatuses is no longer needed. A plurality of printed circuit boards can be assembled simultaneously at one single working place.

BRIEF DESCRIPTION OF THE DRAWINGS

The present invention will be more fully understood by reference to the following detailed description thereof and wherein.

DETAILED DESCRIPTION OF THE PREFERRED EMBODIMENT

Figures 1, 2:
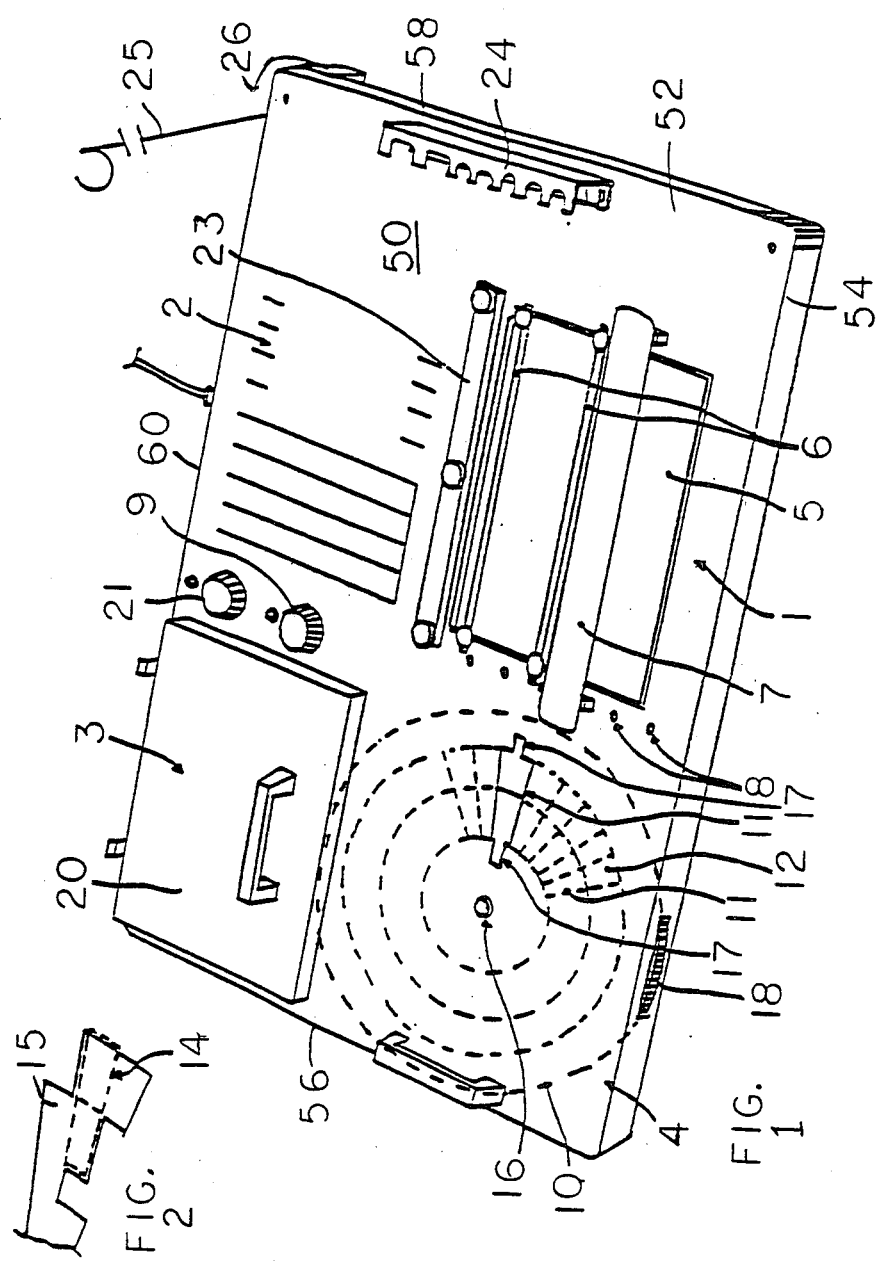
FIG. 1 is a perspective view of an assembly platform.
FIG. 2 is a schematic illustration of the pick-up and retrieving opening of the assembly platform shown in FIG. 1.

The assembly platform 1 having a chassis 50 which includes a generally rectangular, plate-shaped upper surface 52 and incorporates basically four quadrants 1 to 4 such as can clearly be seen from FIG. 1. The first quadrant 1 contains a heatable working surface 5 and the printed circuit board (not shown) can be mounted thereupon by aid of two adjustable fixing rails 6. An adjustable handrest 7 is located above the working surface 5 which handrest 7 may be inserted at the one end thereof by choice in one of a plurality of holes 8 provided in the chassis 50 and may be pivoted around the respective supporting area. The working surface which in this specific embodiment has a size of 8 by 12 inches is adjustably heatable from below by aid of a thermostat up to about 140° F. A corresponding tempeature control knob 9 is located at the upper side of the cabinet.

Adjacent said working surface 5 and below the upper surface 52 of the chassis 50 a component storage rotary carousel 10 is located in a quadrant 4, such as designed in FIG. 1 by broken lines. This component storage rotary carousel includes two concentric rows 11,12 of compartments for electronic devices or components and each compartment row 11,12 is divided e.g. into 30 compartments, such that totally 60 compartments are available. These compartments are formed by not specifically shown bins which can be retrieved. A pick-up and retrieving opening 14 is located at the upper side surface 52 of the chassis 50 and each compartment is accessable from the outside through that opening whereby all other compartments remains covered. A metal lid 15 (FIG. 2) can be moved by means of a knob 16 between three positions and the lid 15 exposes at a given time only one of the compartments 11,12. The reason for this arrangement is that SMD-devices are usually not marked such that a mixing up of different such devices must be avoided at all cost. Adjacent both sides of the pick-up opening 14 there is a window 17 through which the marking of a respective compartment 11,12 can be seen. The circumference of the component storage rotary carousel 10 is shaped to be a hand wheel 18 and projects out at a first predetermined front edge 54 of the upper surface 52 of the assembly platform.

A heating chamber or heating area respectively, 20 is located in a quadrant 3 behind mentioned rotary carousel if seen from the operator side of the assembly platform 1, both the carousel 10 and the heating chamber being located adjacent a second predetermined edge 56 of the upper surface 52 of the chassis 50. This heating chamber 20 consists of a heating plate having the same dimensions as the working surface 5 and a lid which is placeable thereupon. The heating plate is adjustably heatable up to a temperature of about 360° F. The temperature is adjusted by means of knob 21.

In a quadrant 2 located behind the working surface 5 relative to the operator side of the assembly platform 1, and adjacent both a third edge 58 opposite the first predetermined edge 54 and a fourth edge 60 opposite the second predetermined edge 56, a space is provided for commonly used component dispensers for prepackaged components and devices in form of tape- or stick-feeders. By means of a champing rail 23 these devices can be held behind the working surface. Such dispensers are used for the most frequently used devices and components, and the other devices or components, which are used to a smaller extent are stored in the rotary carousel 10.

At the side of the assembly platform a toolstand 24 for the storage of tools such as tweezers, vacuum tools, and dispenser barrels is provided. A flexible suspension means 25 is intended to support and contain the hoses for vacuum tools and a dosing apparatus for the soldering paste.

When using the above described assembly platform two assembly steps can be carried out simultaneously such as indicated below. First a printed circuit board to be equipped with devices or components, respectively, is mounted onto the working surface. The corresponding locations of the printed circuit board are thereafter provided with a dosed amount of soldering past or bonding agent to which end a dosing apparatus of known design and generally available on the market is used while the printed circuit board remains in the position shown. Thereafter the components are inserted manually on the printed circuit board and adhere to the soldering paste or adhesive respectively.

Thereafter the printed circuit board equipped as described above is placed into the heating chamber 20 in which the tin paste is reheated or predried, respectively, at a temperature of e.g. 212° F. or the adhesive is polymerised and made to set, respectively. During the time span during which the equipped printed circuit board is heated in the heating chamber 20 another printed circuit board can be equipped and assembled on the working surface. Thereafter the first printed circuit board may be again placed onto the working surface for the soldering during which the other printed circuit board is preheated in the heating chamber 20. When utilizing the reflow-soldering by means of hot air, soldering copper or iron etc. as well as when using, conventional soldering by means of the soldering copper or iron and at the bonding, i.e. glueing procedure, the heating of the working surface up to about 140° F. supports the soldering process.

In order to achieve a better view of the printed circuit board during the equipping thereof and the soldering thereof on the working surface facilitating the work of the operator the assembly platform can be tilted by aid of a support 26 from a horizontal position to about an inclination of 5°. This support 26 may be a bar pivotably mounted to the rear of the chassis (not shown).

All equipping steps of the SMT-technique can be carried out on this assembly platform without the necessity fo changing the working place. The assembly platform as such is easily transportable and accordingly can be placed within a laboratory at any place suitable for a specific work. The device and components which are stored on this assembly platform are then immediately available at any location to which it has been transported. While there is shown and described a present preferred embodiment of the invention, it is to be distinctly understood that the invention is not limited thereto, but may be otherwise variously embodied and practice within the scope fo the following claims.

What is claimed is:

1. An assembly platform for equipping printed circuit boards with surface mounted components, the assembly platform comprising
    a plate-shaped chassis having an upper surface and including a heatable working surface for receiving a circuit board, the upper surface having an opening therein;
    a component storage rotary carousel located adjacent the heatable working surface and below the upper surface of the chassis, the carousel having a plurality of component storage compartments, each storage compartment being alignable with the opening in the upper surface of the chassis for picking up and retrieving a component in the compartment, the opening in the upper surface of the chassis being sized and positioned to cover all other compartments when a predetermined compartment is aligned with the opening; and
    a closable heating chamber for pre-baking solder paste and curing surface mounting adhesives.

2. An assembly platform according to claim 1, the plate shaped chassis having an area located adjacent the working surface for receiving component dispensers for tape or stickfeeders.

3. An assembly platform according to claim 1, wherein the plate-shaped chassis has a generally rectangular upper surface, the upper surface having a first predetermined edge and a second predetermined edge, the first and second predetermined edges meeting at a corner, the chassis comprising substantially four quadrants, the components storage rotary carousel being located in the quadrants adjacent both the first predetermined edge and the second predetermined edge, the working surface being located in the quadrant adjacent the first predetermined edge and adjacent the edge opposite the second predetermined edge, the area for the component dispensers being located in the quadrant adjacent the edges opposite the first and second predetermined edges, and the closable heating chamber being located in the quadrant adjacent the second predetermined edge and the edge opposite the first predetermined edge.

4. An assembly platform according to claim 3, further including a tool stand mounted adjacent the edge opposite the second predetermined edge.

5. An assembly platform according to claim 1, wherein the component storage rotary carousel comprises two circular and concentric rows of compartments.

6. An assembly platform according to claim 5, comprising a metal lid for the opening in the upper surface of the chassis, the metal lid being movable between three predetermined positions, the metal lid completely covering the opening when the metal lid is positioned in the first predetermined position, the metal lid permitting access to a compartment in the inner row of compartments of the carousel when the carousel is positioned so that a compartment in the inner row is aligned with the opening and the metal lid is in a second predetermined position, and the metal lid permitting access to a compartment in the outer row of compartments in the carousel when the carousel is positioned so that a compartment in the outer row is aligned with the opening and the metal lid is in the third predetermined position.

7. An assembly platform according to claim 1, in which the periphery of the component storage rotary carousel projects out of the chassis beyond the second predetermined edge, the projection of the periphery of the carousel allowing an operator to manually rotate the carousel whereby the individual storage compartments can be rotated into alignment with the opening in the upper surface of the chassis for picking up and retrieving components.

8. An assembly platform according to claim 1, wherein the heating chamber comprises a heated plate and a lid placeable upon the heated plate.

9. An assembly platform according to claim 1, the chassis further comprising a lower surface, the platform further comprising a support located at the lower surface of the chassis at the edge opposite the first predetermined edge of the chassis, the support being adapted to permit the inclination of the chassis to be altered from a horizontal position to an angle of 5° relative to the horizontal position.

* * * * *

UNITED STATES PATENT OFFICE
CERTIFICATE OF CORRECTION

Patent No. 4,756,077  Dated July 12, 1988

Inventor(s) Marco Bianchi

It is certified that error appears in the above-identified patent and that said Letters Patent are hereby corrected as shown below:

Column 1, line 31, after "educational", and before "necessary" insert therefore --research or development purposes has not been available it has been--.

Column 2, line 34, delete "tempeature" and insert therefore --temperature--.

Column 2, line 46, after "upper" and before "surface" delete the word "side".

Column 2, line 60, after "predetermined" and before "front" insert --or--.

Column 3, line 31, after "soldering" delete "past" and insert therefore --paste--.

Signed and Sealed this

Twenty-first Day of March, 1989

Attest:

DONALD J. QUIGG

Attesting Officer

Commissioner of Patents and Trademarks